(12) United States Patent
Mayer et al.

(10) Patent No.: US 7,508,459 B2
(45) Date of Patent: Mar. 24, 2009

(54) METHOD AND APPARATUS FOR PERFORMING CHANNEL DETECTION

(75) Inventors: Matthew Thomas Mayer, Indianapolis, IN (US); Michael Anthony Pugel, Noblesville, IN (US); Max Ward Muterspaugh, Indianapolis, IN (US)

(73) Assignee: Thomson Licensing, Boulogne-Billancourt (FR)

( * ) Notice: Subject to any disclaimer, the term of this patent is extended or adjusted under 35 U.S.C. 154(b) by 813 days.

(21) Appl. No.: 10/523,484

(22) PCT Filed: Aug. 6, 2003

(86) PCT No.: PCT/US03/24576

§ 371 (c)(1), (2), (4) Date: Feb. 4, 2005

(87) PCT Pub. No.: WO2004/015992

PCT Pub. Date: Feb. 19, 2004

(65) Prior Publication Data

US 2006/0038926 A1 Feb. 23, 2006

Related U.S. Application Data

(60) Provisional application No. 60/401,614, filed on Aug. 7, 2002.

(51) Int. Cl.
*H04N 5/50* (2006.01)
*H04N 5/44* (2006.01)

(52) U.S. Cl. .................. 348/731; 348/725; 348/554

(58) Field of Classification Search ......... 348/731–733, 348/725, 555, 558, 554, 726; 455/182.1, 455/182.3, 190.1, 192.1; H04N 5/44, 5/50, H04N 5/46, 3/27
See application file for complete search history.

(56) References Cited

U.S. PATENT DOCUMENTS

| 5,982,457 | A | 11/1999 | Limberg |
| 6,369,857 | B1 | 4/2002 | Balaban et al. |
| 6,961,370 | B2 * | 11/2005 | Chappell .................... 348/731 |
| 2001/0033625 | A1 | 10/2001 | Ninomiya et al. |
| 2002/0036709 | A1 | 3/2002 | Nishida |

FOREIGN PATENT DOCUMENTS

EP 1162836 12/2001

OTHER PUBLICATIONS

Search Report dated Dec. 5, 2003.

* cited by examiner

*Primary Examiner*—Sherrie Hsia
(74) *Attorney, Agent, or Firm*—Robert D. Shedd; Joseph J. Opalach; Brian J. Cromarty

(57) ABSTRACT

A technique for performing channel detection in a device such as a television signal receiver is capable of quickly determining the analog and/or digital broadcast channels available in a given area. According to an exemplary embodiment, a method for performing channel detection includes tuning a first frequency channel, determining whether a signal parameter associated with the first frequency channel exceeds a predetermined threshold, and enabling a first channel acquisition operation responsive to determining that the signal parameter exceeds the predetermined threshold.

24 Claims, 2 Drawing Sheets

METHOD AND APPARATUS FOR PERFORMING CHANNEL DETECTION

CROSS REFERENCE TO RELATED APPLICATIONS

Figure 1:
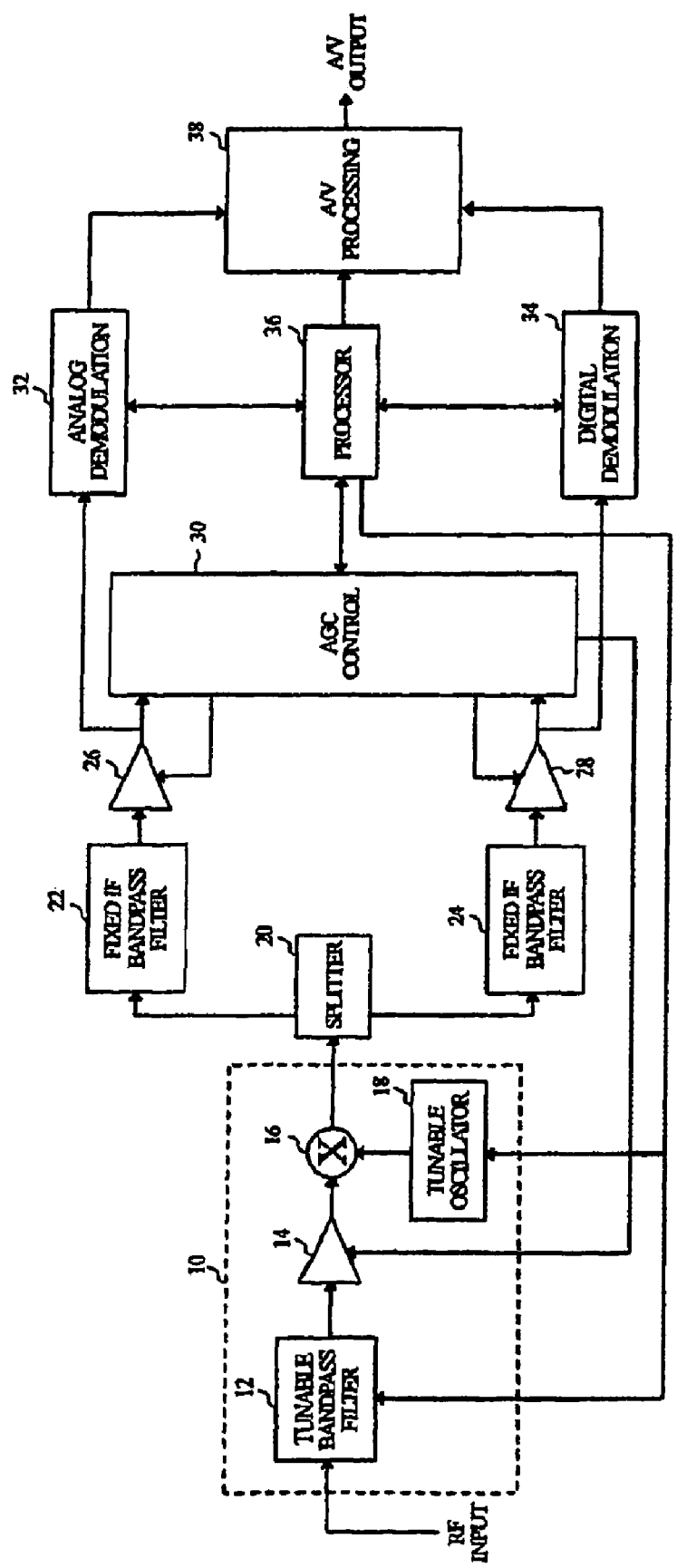

This application claims the benefits, under 35 U.S.C. §365 of International application PCT/US03/24576, filed Aug. 6, 2003, which was published in accordance with PCT Article 21(2) on Feb. 19, 2004 in English and which claims the benefit of U.S. provisional patent application No. 60/401,614, filed Aug. 7, 2002.

The present invention generally relates to channel detection, and more particularly, to a technique for performing channel detection in devices such as a television signal receiver that is capable of quickly determining the analog and/or digital broadcast channels available in a given area.

BACKGROUND OF THE INVENTION

Certain devices such as television signal receivers may be capable of receiving and processing analog and/or digital broadcast signals. With such devices, a user-initiated channel setup process may be performed in order to determine the analog and/or digital broadcast channels available in a given area. Such a channel setup process may for example require a search for both analog broadcast channels, such as National Television Standards Committee (NTSC) channels, and digital broadcast channels, such as Advanced Television Standards Committee (ATSC) channels.

According to one conventional channel setup process, a frequency channel is tuned, and a digital channel acquisition operation is performed. If the digital channel acquisition operation is successful (i.e., a valid digital broadcast channel is detected on the tuned frequency channel), then the digital broadcast channel is added to a list of valid broadcast channels. Alternatively, if the digital channel acquisition operation is unsuccessful (i.e., a valid digital broadcast channel is not detected on the tuned frequency channel), then the digital channel acquisition operation is terminated, and an analog channel acquisition operation is performed. If the analog channel acquisition operation is successful (i.e., a valid analog broadcast channel is detected on the tuned frequency channel), then the analog broadcast channel is added to the list of valid broadcast channels. Alternatively, if the analog channel acquisition operation is unsuccessful (i.e., a valid analog broadcast channel is not detected on the tuned frequency channel), then the analog channel acquisition operation is terminated, and another frequency channel is tuned where the digital and analog channel acquisition operations are repeated.

With the aforementioned channel setup process, the longest amount of time in searching a particular frequency channel occurs when no signal is present on that frequency channel since both the digital and analog channel acquisition operations must be performed in order to gain confidence that there is really no signal present. In such cases, the overall time required for the channel setup process may become unduly protracted, and therefore unacceptable to many users.

Accordingly, there is a need for a technique for performing channel detection in devices such as a television signal receiver which avoids the foregoing problems, and is capable of quickly determining the analog and/or digital broadcast channels available in a given area. The present invention addresses these and other issues.

BRIEF SUMMARY OF THE INVENTION

In accordance with an aspect of the present invention, a method for performing channel detection is disclosed. According to an exemplary embodiment, the method comprises steps of tuning a first frequency channel, determining whether a signal parameter associated with said first frequency channel exceeds a predetermined threshold, and enabling a first channel acquisition operation responsive to determining that said signal parameter exceeds said predetermined threshold.

In accordance with another aspect of the present invention, an apparatus for performing channel detection is disclosed. According to an exemplary embodiment, the apparatus comprises tuning means for tuning a first frequency channel. Processing means determine whether a signal parameter associated with the first frequency channel exceeds a predetermined threshold, and enable a first channel acquisition operation responsive to determining that the signal parameter exceeds the predetermined threshold.

In accordance with yet another aspect of the present invention, a television signal receiver is disclosed. According to an exemplary embodiment, the television signal receiver comprises a tuner operative to tune a first frequency channel. A processor is operative to determine whether a signal parameter associated with the first frequency channel exceeds a predetermined threshold. A first demodulator is operative to perform a first channel acquisition operation responsive to the processor determining that the signal parameter exceeds the predetermined threshold.

BRIEF DESCRIPTION OF THE SEVERAL VIEWS OF THE DRAWING(S)

Figure 2:
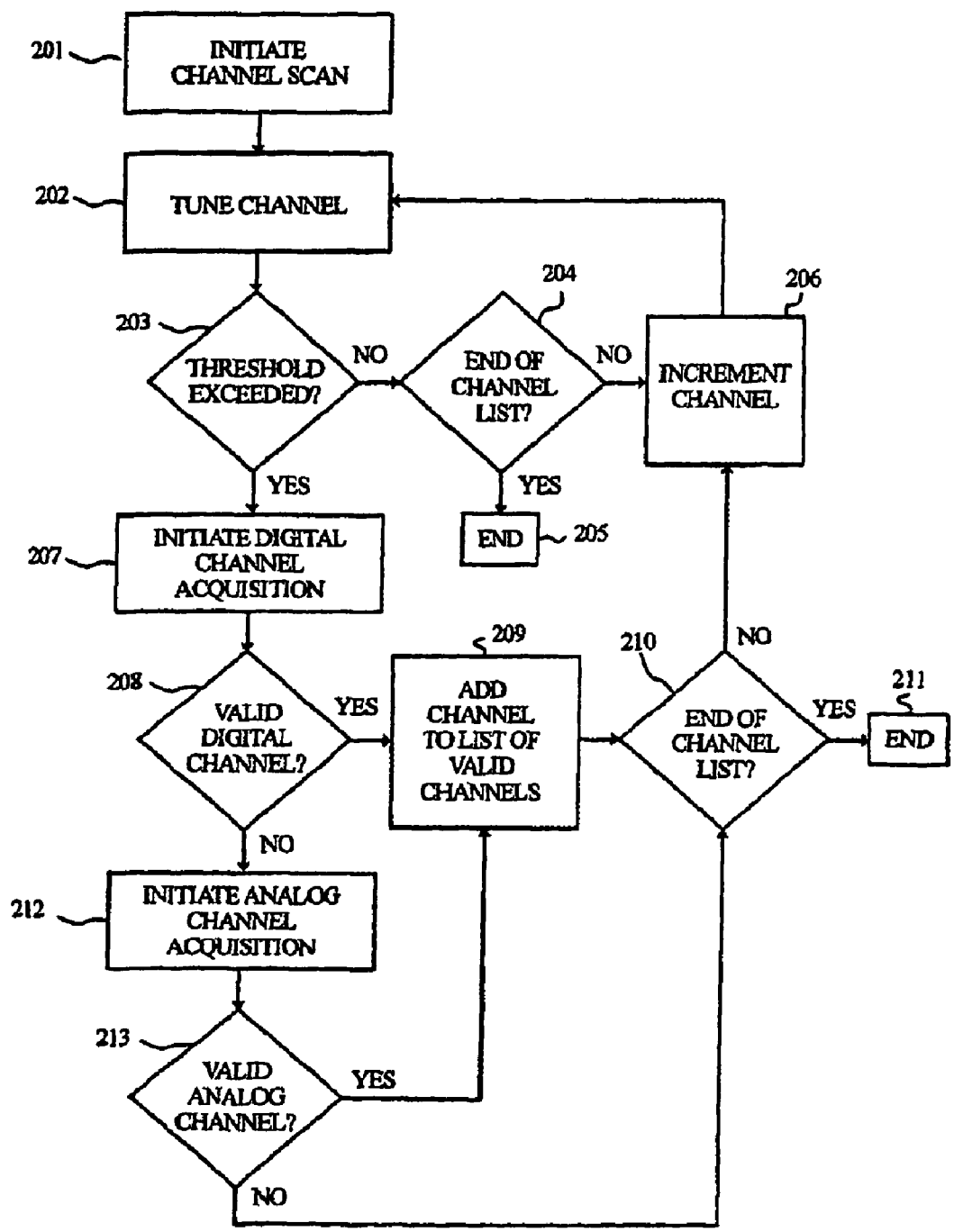

The above-mentioned and other features and advantages of this invention, and the manner of attaining them, will become more apparent and the invention will be better understood by reference to the following description of embodiments of the invention taken in conjunction with the accompanying drawings, wherein:

FIG. 1 is a block diagram of an exemplary apparatus suitable for implementing the present invention; and FIG. 2 is a flowchart illustrating steps according to an exemplary embodiment of the present invention.

DETAILED DESCRIPTION OF THE INVENTION

The exemplifications set out herein illustrate preferred embodiments of the invention, and such exemplifications are not to be construed as limiting the scope of the invention in any manner.

Referring now to the drawings, and more particularly to FIG. 1, a block diagram of an exemplary apparatus 100 suitable for implementing the present invention is shown. For purposes of example and explanation, apparatus 100 represents a portion of a television signal receiver. However, it will be intuitive to those skilled in the art that the principles of the present invention may be applied to other apparatuses or devices, such as those used in a frequency division multiplexing (FDM) system.

Apparatus 100 comprises tuning means such as tuner 10 which includes tunable filter means such as tunable bandpass filter 12, radio frequency (RF) amplification means such as RF amplifier 14, signal mixing means such as signal mixer 16, and tunable oscillation means such as tunable oscillator 18. Apparatus 100 further comprises signal splitting means such as signal splitter 20, intermediate frequency (IF) filtering means such as fixed IF bandpass filters 22 and 24, IF amplification means such as IF amplifiers 26 and 28, automatic gain control (AGC) means such as AGC control block 30, analog demodulation means such as analog demodulation block 32, digital demodulation means such as digital demodulation block 34, processing means such as processor 36, and audio and/or video (A/V) processing means such as A/V processing block 38. The foregoing elements of apparatus 100 may for example be implemented using integrated circuits (ICs).

In FIG. 1, tuner 10 is operative to receive an RF input signal and perform a tuning operation thereon to thereby generate and output a tuned IF signal. The RF input signal may be provided to tuner 10 via any wired or wireless signal source such as, but not limited to, a cable, terrestrial or satellite broadcast. For purposes of example, tuner 10 is shown in FIG. 1 as a single frequency conversion tuner. However, it will be intuitive to those skilled in the art that the principles of the present invention may be applied to any tuner architecture.

With respect to tuner 10, tunable bandpass filter 12 is operative to filter the RF input signal responsive to a control signal provided from processor 36 to thereby generate and output a tuned RF signal. RF amplifier 14 is operative to amplify the tuned RF signal provided from tunable bandpass filter 12 responsive to an RF gain control signal provided from AGC control block 30 to thereby generate and output an amplified RF signal. Signal mixer 16 is operative to mix the amplified RF signal provided from RF amplifier 14 with an output frequency signal provided from tunable oscillator 18 to thereby generate and output the tuned IF signal, which is nominally 44 MHz. Tunable oscillator 18 generates the output frequency signal responsive to a control signal provided from processor 36.

Signal splitter 20 is operative to split the tuned IF signal provided from tuner 10 into at least two different signal paths. Fixed IF bandpass filters 22 and 24 are operative to filter the tuned IF signal provided from signal splitter 20 to thereby generate and output filtered IF signals. IF amplifiers 26 and 28 are operative to amplify the filtered IF signals provided from fixed IF bandpass filters 22 and 24, respectively, responsive to an IF gain control signal provided from AGC control block 30 to thereby generate and output amplified IF signals.

AGC control block 30 is operative to perform various operations, including signal parameter detection and gain control operations. According to an exemplary embodiment, AGC control block 30 includes a detector (not shown) such as a root mean squared (RMS) detector which is operative to detect a signal parameter such as amplitude or other parameter associated with the amplified IF signals provided from IF amplifiers 26 and 28. Also according to an exemplary embodiment, AGC control block 30 provides the RF gain control signal to increase the gain of RF amplifier 14 as the detected amplitude of the incoming, amplified IF signals from IF amplifiers 26 and 28 drops. Once RF amplifier 14 has reached maximum gain, and the detected amplitude of the amplified IF signals continues to drop, AGC control block 30 then provides the IF gain control signal to increase the gains of IF amplifiers 26 and 28.

According to an exemplary embodiment, AGC control block 30 provides a digitized version of the IF gain control signal to processor 36 as an estimate of the amplitude of the incoming RF signal to tuner 10. As will be described later herein, processor 36 compares the digitized IF gain control signal to a predetermined threshold to determine whether a currently tuned frequency channel likely includes a valid analog or digital broadcast channel. According to the present invention, channel acquisition operations are not initiated for a given frequency channel until the predetermined threshold is exceeded. In this manner, channel detection according to the present invention can be performed substantially faster than conventional channel detection techniques since channel acquisition operations are not initiated until there is a reasonable degree of certainty that a valid analog or digital broadcast channel is present on a given frequency channel. Further details regarding these aspects of the present invention will be provided later herein.

Analog demodulation block 32 is operative to perform various operations, including analog channel acquisition and demodulation operations. According to an exemplary embodiment, analog demodulation block 32 initiates an analog channel acquisition operation upon the amplified IF signal provided from IF amplifier 26 responsive to a control signal provided from processor 36 to thereby determine whether a valid analog broadcast channel is present on a currently tuned frequency channel. Analog demodulation block 32 provides a signal indicating the result of this determination back to processor 36. According to an exemplary embodiment, analog demodulation block 32 performs the analog channel acquisition operation to acquire an NTSC channel, although other types of analog channels (e.g., PAL, SECAM, etc.) may also be accommodated according to the present invention. Analog demodulation block 32 is also operative to demodulate the amplified IF signal provided from IF amplifier 26 to thereby generate and output a demodulated analog signal.

Digital demodulation block 34 is operative to perform various operations, including digital channel acquisition and demodulation operations. According to an exemplary embodiment, digital demodulation block 34 initiates a digital channel acquisition operation upon the amplified IF signal provided from IF amplifier 28 responsive to a control signal provided from processor 36 to thereby determine whether a valid digital broadcast channel is present on a currently tuned frequency channel. Digital demodulation block 34 provides a signal indicating the result of this determination back to processor 36. According to an exemplary embodiment, digital demodulation block 34 performs the digital channel acquisition operation to acquire an ATSC channel, although other types of digital channels (e.g., ISDB-T, DVB-T, DVB-C, etc.) may also be accommodated according to the present invention. Digital demodulation block 34 is also operative to demodulate the amplified IF signal provided from IF amplifier 28 to thereby generate and output a demodulated digital signal.

Processor 36 is operative to perform various operations, including memory, threshold detection, channel acquisition control, and frequency control operations. According to an exemplary embodiment, processor 36 is operative to compare the digitized IF gain control signal provided from AGC control block 30 to a predetermined threshold to determine whether a currently tuned frequency channel likely includes a valid analog or digital broadcast channel. The actual threshold used by processor 36 in this operation is a matter of design choice, and may be based on one or more factors associated with a particular application, such as the type of signal modulation and/or the signal source. Moreover, the threshold used by processor 36 may vary during a particular channel scan operation based on factors such as signal modulation and/or signal source.

With respect to signal modulation for example, an 8 level digital vestigial sideband (8-VSB) modulated signal may require a signal-to-noise ratio (SNR) greater than 15 dB to produce a usable signal. As another example, a 256 level digital quadrature amplitude modulated (256-QAM) signal may require a SNR greater than 27 dB to produce a usable signal. Accordingly, the threshold used for a 256-QAM application may for example be set 12 dB higher than the threshold used for an 8-VSB application. Analog modulation, such as NTSC modulation, may have other requirements such as maintaining peak power constant over time, and therefore may use a threshold based on other design considerations.

With respect to signal source, cable television standards typically use well-defined signal power levels that are substantially higher than the signal power levels found in a terrestrial broadcast system. Accordingly, the threshold used for a cable application may be substantially higher than the threshold used for a terrestrial application. According to an exemplary embodiment, the threshold used may be the lowest common denominator for various applications if a simpler, but less effective implementation is acceptable. In any event, the actual threshold used by processor 36 is a matter of design choice, and may be selected appropriately for a given application.

According to an exemplary embodiment, processor 36 enables channel acquisition operations to be performed only when the digitized IF gain control signal provided from AGC control block 30 exceeds the predetermined threshold. As previously indicated herein, processor 36 is operative to provide control signals to analog and digital demodulation blocks 32 and 34 to initiate analog and digital channel acquisition operations, respectively. As will be discussed later herein, processor 36 may also cause tuner 10 to tune another frequency channel when certain conditions are satisfied, such as when the digitized IF gain control signal provided from AGC control block 30 does not exceed the predetermined threshold.

AN processing block 38 is operative to process the demodulated analog and digital signals provided from analog and digital demodulation blocks 32 and 34, respectively, to thereby generate and provide AN outputs. According to an exemplary embodiment, AN processing block 38 is operative to digitize and process the demodulated analog signal provided from analog demodulation block 32, which may for example be an NTSC signal or other type of analog signal. Also according to an exemplary embodiment, AN processing block 38 is operative to process the demodulated digital signal provided from digital demodulation block 34, which may for example be an ATSC signal or other type of digital signal.

To facilitate a better understanding of the inventive concepts of the present invention, a more specific example will now be provided. Referring to FIG. 2, a flowchart 200 illustrating steps according to an exemplary embodiment of the present invention is shown. For purposes of example and explanation, the steps of FIG. 2 will be described with reference to apparatus 100 of FIG. 1. The steps of FIG. 2 are merely exemplary, and are not intended to limit the present invention in any manner.

At step 201, a channel scan operation is initiated. According to an exemplary embodiment, the channel scan operation may be performed in response to a user input to apparatus 100, such as via a remote control device (not shown in FIG. 1). The channel scan operation may for example be part of a user setup process for apparatus 100. As will be described hereafter, the channel scan operation involves sequentially tuning different frequency channels to detect the analog and/or digital broadcast channels available in a given area.

Different types of channel scan operations may be performed according to the present invention. For example, one type of channel scan operation (e.g., a quick scan) may be performed for a particular RF input (e.g., antenna A, antenna B, etc.) and/or signal source (e.g., cable, terrestrial, satellite, etc.) selected by a user. Another type of channel scan operation (e.g., a full scan) may for example be performed for all available RF inputs and all available signal sources. Other types of channel scan operations may also be performed according to the present invention.

At step 202, a frequency channel is tuned. According to an exemplary embodiment, tuner 10 tunes a frequency channel responsive to control signals provided to tunable bandpass filter 12 and tunable oscillator 18 from processor 36. Also according to an exemplary embodiment, the frequency channel tuned at step 202 is from a predetermined channel list used by processor 36 when performing the channel scan operation.

At step 203, a determination is made as to whether a signal parameter associated with the frequency channel tuned at step 202 exceeds a predetermined threshold. According to an exemplary embodiment previously described herein, AGC control block 30 is operative to provide a digitized version of the IF gain control signal to processor 36 as an estimate of the amplitude of the incoming RF signal to tuner 10. With this exemplary embodiment, processor 36 compares the digitized IF gain control signal to the predetermined threshold (which is a matter of design choice) and thereby determines whether the threshold is exceeded, at step 203.

If the determination at step 203 is negative, process flow advances to step 204 where a determination is made by processor 36 as to whether the end of the channel list has been reached. If the determination at step 204 is positive, process flow advances to step 205 where the process ends.

If the determination at step 204 is negative, process flow advances to step 206 where processor 36 increments the current frequency channel to the next (e.g., higher) frequency channel. Process flow then loops back to step 202 where processor 36 provides control signals to tunable bandpass filter 12 and tunable oscillator 18 of tuner 10 to thereby tune the next frequency channel.

If the determination at step 203 is positive, process flow advances to step 207 where a digital channel acquisition operation is initiated. According to an exemplary embodiment, the digital channel acquisition operation includes acquisition of a digital broadcast channel, such as an ATSC channel or other type of digital broadcast channel. Also according to an exemplary embodiment, processor 36 provides a control signal to digital demodulation block 34 to initiate the digital channel acquisition operation, which may include known operations such as trying to achieve carrier synchronization, symbol timing synchronization, and equalization lock on the amplified IF signal provided from IF amplifier 28. Other types of digital channel acquisition operations may also be performed according to the present invention.

Next, at step 208, a determination is made as to whether a valid digital broadcast channel is detected from the digital channel acquisition operation initiated at step 207. According to an exemplary embodiment, digital modulation block 34 provides a control signal to processor 36 indicating whether a valid digital broadcast channel is detected, namely whether carrier, symbol timing, and equalization lock is achieved on the amplified IF signal provided from IF amplifier 28.

If the determination at step 208 is positive, process flow advances to step 209 where processor 36 adds the detected digital broadcast channel to a list of valid broadcast channels. Next, at step 210, a determination is made by processor 36 as to whether the end of the channel list has been reached. If the determination at step 210 is positive, process flow advances to step 211 where the process ends.

If the determination at step 210 is negative, process flow loops back to step 206, where processor 36 increments the current frequency channel to the next (e.g., higher) frequency channel. Process flow then loops back to step 202 where processor 36 provides control signals to tunable bandpass filter 12 and tunable oscillator 18 of tuner 10 to thereby tune the next frequency channel.

If the determination at step 208 is negative, process flow advances to step 212 where an analog channel acquisition operation is initiated. According to an exemplary embodiment, the analog channel acquisition operation includes acquisition of an analog broadcast channel, such as an NTSC channel or other type of analog broadcast channel. Also according to an exemplary embodiment, processor 36 provides a control signal to analog demodulation block 32 to initiate the analog channel acquisition operation, which may include performing known operations such as automatic fine tuning (AFT) crossover and/or horizontal synchronization detection operations on the amplified IF signal provided from IF amplifier 26. Other types of analog channel acquisition operations may also be performed according to the present invention.

Next, at step 213, a determination is made as to whether a valid analog broadcast channel is detected from the analog channel acquisition operation initiated at step 212. According to an exemplary embodiment, analog modulation block 32 provides a control signal to processor 36 indicating whether a valid analog broadcast channel is detected, namely whether the AFT crossover and/or horizontal synchronization detection operations are successfully performed on the amplified IF signal provided from IF amplifier 26.

If the determination at step 213 is positive, process flow loops back to step 209 where processor 36 adds the detected analog broadcast channel to the list of valid broadcast channels. Process flow then advances to step 210 and continues in the manner previously described herein, as indicated in FIG. 2. If the determination at step 213 is negative, process flow loops back to step 210 and continues in the manner previously described herein, as indicated in FIG. 2. Once the steps of FIG. 2 are repeated for all frequency channels of the channel list, the resultant list of valid broadcast channels may be used to enable channel selection by a user.

Numerous variations of FIG. 2 may also be performed according to the present invention. For example, FIG. 2 shows the digital channel acquisition operation being performed before the analog channel acquisition operation (see steps 207 and 212). In practice, however, it may be desirable to perform the analog channel acquisition operation before the digital channel acquisition operation. For example, in certain cable applications, channel detection may be performed more rapidly if the analog channel acquisition operation is performed before the digital channel acquisition operation. Accordingly, the order in which the digital and analog channel acquisition operations are performed is a matter of design choice.

According to another variation of FIG. 2, certain channel scan operations may utilize a plurality of different predetermined thresholds (see step 203). For example, when performing a channel scan operation for a particular signal source (e.g., digital cable broadcast source, etc.), a particular frequency channel may be searched for signals having different types of signal modulation (e.g., 8-VSB, 64-QAM, 256-QAM, etc.), and a different predetermined threshold may be used for each type of signal modulation. Accordingly, the predetermined threshold used during a particular channel scan operation may vary based on factors such as signal source (e.g., cable, terrestrial, satellite, etc.) and/or signal modulation. Other variations of FIG. 2 may also be performed according to the present invention.

As described herein, the present invention provides a technique for performing channel detection in devices such as a television signal receiver that is capable of quickly determining the analog and/or digital broadcast channels available in a given area. In particular, it is noted that a given channel acquisition operation may take anywhere from 500 to 2000 milliseconds to fail, depending on the particular implementation. In contrast, the process of determining whether a signal parameter such as amplitude associated with a given frequency channel exceeds a predetermined threshold (i.e., see step 203) may take no more than 200 milliseconds. Accordingly, by performing this step before initiating any channel acquisition operations, the present invention saves a substantial amount of time as compared to conventional channel detection techniques.

The present invention is particularly applicable to various apparatuses, either with or without a display device. Accordingly, the phrase "television signal receiver" as used herein may refer to systems or apparatuses including, but not limited to, television sets, computers or monitors that include a display device, and systems or apparatuses such as set-top boxes, video cassette recorders (VCRs), digital versatile disk (DVD) players, video game boxes, personal video recorders (PVRs), computers or other apparatuses that may not include a display device.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

The invention claimed is:

1. A method for performing channel detection, comprising:
   tuning a first frequency channel;
   determining whether a signal parameter associated with said first frequency channel exceeds a predetermined threshold; and
   enabling a first channel acquisition operation responsive to determining that said signal parameter exceeds said predetermined threshold;
   wherein said predetermined threshold varies based on at least one of signal source or signal modulation.

2. The method of claim 1, further comprised of enabling a second channel acquisition operation after enabling said first channel acquisition operation.

3. The method of claim 2, wherein:
   said first channel acquisition operation includes acquisition of a digital broadcast channel; and
   said second channel acquisition operation includes acquisition of an analog broadcast channel.

4. The method of claim 3, wherein:
   said digital broadcast channel is an ATSC channel; and
   said analog broadcast channel is an NTSC channel.

5. The method of claim 2, wherein:
   said first channel acquisition operation includes acquisition of an analog broadcast channel; and
   said second channel acquisition operation includes acquisition of a digital broadcast channel.

6. The method of claim 5, wherein:
   said analog broadcast channel is an NTSC channel; and
   said digital broadcast channel is an ATSC channel.

7. The method of claim 1, further comprised of tuning a second frequency channel responsive to determining that said signal parameter does not exceed said predetermined threshold.

8. The method of claim 1, wherein said signal parameter includes amplitude.

9. An apparatus for performing channel detection, comprising:
tuning means for tuning a first frequency channel; and
processing means for determining whether a signal parameter associated with said first frequency channel exceeds a predetermined threshold, and for enabling a first channel acquisition operation responsive to determining that said signal parameter exceeds said predetermined threshold;
wherein said predetermined threshold varies based on at least one of signal source or signal modulation.

10. The apparatus of claim 9, wherein said processing means further enables a second channel acquisition operation after enabling said first channel acquisition operation.

11. The apparatus of claim 10, wherein:
said first channel acquisition operation includes acquisition of a digital broadcast channel; and
said second channel acquisition operation includes acquisition of an analog broadcast channel.

12. The apparatus of claim 11, wherein:
said digital broadcast channel is an ATSC channel; and
said analog broadcast channel is an NTSC channel.

13. The apparatus of claim 10, wherein:
said first channel acquisition operation includes acquisition of an analog broadcast channel; and
said second channel acquisition operation includes acquisition of a digital broadcast channel.

14. The apparatus of claim 13, wherein:
said analog broadcast channel is an NTSC channel; and
said digital broadcast channel is an ATSC channel.

15. The apparatus of claim 9, wherein said tuning means tunes a second frequency channel responsive to said processing means determining that said signal parameter does not exceed said predetermined threshold.

16. The apparatus of claim 9, wherein said signal parameter includes amplitude.

17. A television signal receiver, comprising:
a tuner operative to tune a first frequency channel;
a processor operative to determine whether a signal parameter associated with said first frequency channel exceeds a predetermined threshold; and
a first demodulator operative to perform a first channel acquisition operation responsive to said processor determining that said signal parameter exceeds said predetermined threshold;
wherein said predetermined threshold varies based on at least one of signal source or signal modulation.

18. The television signal receiver of claim 17, further comprising a second demodulator operative to perform a second channel acquisition operation after said first demodulator performs said first channel acquisition operation.

19. The television signal receiver of claim 18, wherein:
said first channel acquisition operation includes acquisition of a digital broadcast channel; and
said second channel acquisition operation includes acquisition of an analog broadcast channel.

20. The television signal receiver of claim 19, wherein:
said digital broadcast channel is an ATSC channel; and
said analog broadcast channel is an NTSC channel.

21. The television signal receiver of claim 18, wherein:
said first channel acquisition operation includes acquisition of an analog broadcast channel; and
said second channel acquisition operation includes acquisition of a digital broadcast channel.

22. The television signal receiver of claim 21, wherein:
said analog broadcast channel is an NTSC channel; and
said digital broadcast channel is an ATSC channel.

23. The television signal receiver of claim 17, wherein said tuner is further operative to tune a second frequency channel responsive to said processor determining that said signal parameter does not exceed said predetermined threshold.

24. The television signal receiver of claim 17, wherein said signal parameter includes amplitude.

* * * * *